US012625169B2

(12) United States Patent
Spitzer et al.

(10) Patent No.: US 12,625,169 B2
(45) Date of Patent: May 12, 2026

(54) MAGNETIC CORELESS CURRENT SENSOR MODULE

(71) Applicant: Infineon Technologies AG, Neubiberg (DE)

(72) Inventors: Dietmar Spitzer, Völkermarkt (AT); Tomas Reiter, Ottobrunn (DE); Gaetano Formato, Villach (AT)

(73) Assignee: Infineon Technologies AG, Neubiberg (DE)

( * ) Notice: Subject to any disclaimer, the term of this patent is extended or adjusted under 35 U.S.C. 154(b) by 545 days.

(21) Appl. No.: 18/154,499

(22) Filed: Jan. 13, 2023

(65) Prior Publication Data

US 2023/0273244 A1 Aug. 31, 2023

(30) Foreign Application Priority Data

Jan. 28, 2022 (DE) .......................... 102022101970.5

(51) Int. Cl.
*G01R 15/20* (2006.01)
*G01R 19/00* (2006.01)
(52) U.S. Cl.
CPC ......... *G01R 15/207* (2013.01); *G01R 15/202* (2013.01); *G01R 19/0092* (2013.01)
(58) Field of Classification Search
CPC . G01R 15/207; G01R 15/202; G01R 19/0092
USPC .... 324/117 H, 600, 750.27, 76.11, 126, 500, 324/756.05, 538
See application file for complete search history.

(56) References Cited

U.S. PATENT DOCUMENTS

| | | | | |
|---|---|---|---|---|
| 8,587,298 | B2 * | 11/2013 | Krella | G01R 15/207 324/251 |
| 8,779,756 | B2 * | 7/2014 | Nomura | G01R 15/205 324/144 |
| 11,899,047 | B1 * | 2/2024 | Theuss | G01R 19/10 |
| 2018/0321283 | A1 * | 11/2018 | Sei | G01R 3/00 |
| 2020/0256891 | A1 * | 8/2020 | Williams | H01R 31/005 |
| 2020/0271696 | A1 * | 8/2020 | Nakada | G01R 31/42 |
| 2021/0027928 | A1 * | 1/2021 | Patel | H01F 27/2828 |
| 2022/0091160 | A1 * | 3/2022 | Wriesnegger | G01R 33/06 |

(Continued)

FOREIGN PATENT DOCUMENTS

| | | |
|---|---|---|
| CN | 102265167 A | 11/2011 |
| DE | 102012202826 A1 | 8/2013 |
| EP | 2060923 A2 | 5/2009 |

(Continued)

*Primary Examiner* — Huy Q Phan
*Assistant Examiner* — Trung Q Nguyen
(74) *Attorney, Agent, or Firm* — Harrity & Harrity, LLP

(57) ABSTRACT

A magnetic coreless current sensor module for measuring an electric current flowing in a busbar, wherein the current sensor module comprises an electronic component which is configured for the measurement of current, an electrically insulating encapsulation, in which the electronic component is at least partially encapsulated, wherein the electrically insulating encapsulation comprises at least one connecting hole for connecting to the busbar, and at least one press-fit element for connecting the encapsulation to the busbar using the introduction of the at least one press-fit element into the at least one connecting hole of the electrically insulating encapsulation and into at least one further connecting hole of the busbar.

27 Claims, 7 Drawing Sheets

(56) References Cited

U.S. PATENT DOCUMENTS

2022/0128604 A1* 4/2022 Han ......................... H03F 3/21

FOREIGN PATENT DOCUMENTS

EP 2811305 A1 12/2014
JP 2015-11844 A 1/2015

* cited by examiner

MAGNETIC CORELESS CURRENT SENSOR MODULE

CROSS REFERENCE TO RELATED APPLICATION

This application claims priority to German Patent Application No. 102022101970.5 filed on Jan. 28, 2022, the content of which is incorporated by reference herein in its entirety.

TECHNICAL FIELD

Various implementations relate in general to current sensor modules for the measurement of an electric current flowing in a busbar, electronic devices, an application of a current sensor module or an electronic device, and a method for the retrofitting of a busbar with a magnetic coreless current sensor module.

BACKGROUND

For the control of a vehicle, for example, current sensors are required for the monitoring of electric circuit elements, which detect electric currents flowing in conductors and transmit signals detected to an evaluation apparatus.

Conventionally, current sensors are employed for this purpose which comprise a current-carrying conductor (for example a busbar) wherein, using a magnetic core, the surrounding magnetic field is concentrated, and the strength of the electric current flowing in the conductor is concluded from the magnetic field strength.

It has further been proposed that a current sensor with no magnetic core is screwed to a busbar.

SUMMARY

There is a potential requirement for a compact current sensor module having a high performance capability.

According to one example implementation of a first aspect, a magnetic coreless current sensor module for measuring an electric current flowing in a busbar is provided, wherein the current sensor module includes an electronic component which is configured for the measurement of current, an electrically insulating encapsulation, in which the electronic component is at least partially encapsulated, wherein the electrically insulating encapsulation includes at least one connecting hole for connecting to the busbar, and at least one press-fit element for connecting the encapsulation to the busbar using the introduction of the at least one press-fit element into the at least one connecting hole of the electrically insulating encapsulation and into at least one further connecting hole of the busbar.

According to a further example implementation of the first aspect, an electronic device is provided, which includes a magnetic coreless current sensor module having the above-mentioned features for measuring an electric current flowing in a busbar, and the busbar having at least one further connecting hole for connecting to the current sensor module, wherein the encapsulation is connected or connectable to the busbar using the introduction of the at least one mechanical press-fit element into the at least one connecting hole of the electrically insulating encapsulation and into the at least one further connecting hole of the busbar.

According to one example implementation of a second aspect, a magnetic coreless current sensor module is provided for measuring an electric current flowing in a busbar, wherein the current sensor module includes an electronic component which is configured for the measurement of current, an electrically insulating encapsulation, in which the electronic component is at least partially encapsulated, wherein the electrically insulating encapsulation is configured for connecting to the busbar, and at least one electromechanical connection apparatus, which is released from the encapsulation, for the communication of a sensor signal which is detected by the electronic component.

According to a further example implementation of the second aspect, an electronic device is provided which includes a magnetic coreless current sensor module having the above-mentioned features for measuring an electric current flowing in a busbar, wherein at least one electromechanical connection element is plugged or pluggable into the at least one electromechanical connection apparatus, and the busbar which is connected or connectable to the current sensor module.

According to one further example implementation, a current sensor module according to the first aspect or according to the second aspect, or an electronic device according to the first aspect or according to the second aspect is employed for an application in the group included of a motor vehicle application, a rail vehicle application and an industrial application.

According to one further example implementation, a method is provided for retrofitting a busbar with a magnetic coreless current sensor module, wherein the method includes the provision of a magnetic coreless current sensor module according to the first aspect, and the connection of the encapsulation to the busbar using the introduction of the at least one mechanical press-fit element into the at least one connecting hole of the encapsulation and into the at least one further connecting hole in the busbar.

An example implementation according to the first aspect provides an advantage in that, on the grounds of its magnetic coreless configuration, the current sensor module can assume a compact and lightweight design, with limited complexity of manufacture. Structural space can be saved as a result. This permits the employment of power margins of conventional ratings. Moreover, the above-mentioned magnetic coreless current sensor module can be universally employed for the retrofitting of a busbar with a current measurement function, without the necessity for any application-specific adaptation. In particular, such retrofitting can also be permitted for busbars of different thicknesses and sizes. In this connection, it has proved to be particularly advantageous for one or more press-fit elements to be employed for the connection of an encapsulated current measurement component to a busbar, which is/are press-fitted or introduced into corresponding connecting holes in the busbar and the encapsulation. By way of distinction from conventionally employed connection means in the form of screws, the press-fitting of a press-fit element into connecting holes in the busbar and the encapsulation does not result in any unwanted abrasion of magnetic particles, which might substantially corrupt magnetic current measurement. More significantly still, the employment of at least one press-fit element for connecting the busbar and the encapsulation using press-fitting ensures that the connection of the busbar and the encapsulation itself, under harsh environmental conditions in long-term operation, is reliably protected against any unintentional loosening. Further to the press-fitting of a press-fit element into connecting holes of the busbar and the encapsulation, a constant long-term spatial relationship between the busbar and the encapsulation can thus be maintained, such that there is no significant variation in the sensor characteristic over time. This makes a magnetic coreless current sensor module according to the first aspect particularly suitable for applications in which, in a harsh environment, error-resistant and maintenance-free operation must be ensured over a prolonged period. This is a requirement, for example, in motor vehicle applications. Press-fit elements, moreover, are suitable for production with a high throughput, as the latter can be dispensed, for example, from a belt or a dispenser.

An example implementation according to the second aspect also provides an advantage in that, on the grounds of its magnetic coreless configuration, the current sensor module can be produced, with limited complexity of manufacture, in a compact and lightweight, and thus space-saving manner, and can be employed as a universal retrofitting assembly. Moreover, based on the electromechanical connection apparatus which extends from the encapsulation, it is possible, using measuring current-related signals which are detected using the electronic component, to permit further processing in a peripheral electronic environment. Sensor signals can thus be tapped-off and relayed from the electromechanical connection apparatus. By the constitution of a mechanical connection with the connection apparatus, an electrical coupling is simultaneously effected, using which sensor signals can be relayed. For example, but not compulsorily, the electromechanical connection apparatus can include at least one connecting bush, into which connection elements can be introduced to form an electrically conductive connection with the connecting bush. Equalization of tolerances can thus be executed. An electromechanical connection apparatus can, moreover, be intuitively handled by a user, in order to permit sensor signals to undergo further processing or evaluation.

According to example implementations, the first aspect and the second aspect can be implemented separately from one another, or can be mutually combined.

In the context of the present application, by the term "magnetic coreless current sensor module", it can be specifically understood that the current sensor module is configured with no magnetic flux concentrator. In other words, the current sensor module can be free of any magnetic core which concentrates a magnetic field generated by an electric current flowing in a busbar in the region of an electronic current measurement component. Instead, in the case of a magnetic coreless current sensor module, the magnetic field generated by an electric current flowing in the busbar can be detected directly by the electronic component for the measurement of current.

In the context of the present application, the term "busbar" can be particularly understood as a conductor rail in which an electric current flows during operation. For example, a busbar can be formed of metal strips which, for example, can be structured. Using such structuring, for example, metal strips can be provided with one or more connecting holes and/or can incorporate localized thinning for the refinement of current measurement. The busbar can preferably be formed of a metallic material, for example copper, aluminum or iron. In particular, a busbar can be a conductor bus which, by way of an assembly of electrical conductors, can function as a central distributor of electrical energy. For example, incoming and outgoing conductors can be connected to a conductor bus of this type.

In the context of the present application, the term "electronic component for the measurement of current" can be particularly understood as an electronic component which can generate sensor signals which are indicative of an electric current in an adjoining busbar. In particular, the electronic component can be a Hall effect sensor which, in the presence of a magnetic field which is generated by the electric current which is to be measured, detects a Hall voltage, which represents a measure of electric current strength. In particular, the electronic component can be configured in the form of a semiconductor component, more particularly as a semiconductor chip. Hall effect sensors can be formed, for example, of doped crystalline semiconductor layers, which can include electrodes. Using two opposing electrodes, an auxiliary current can be injected, whereas two further electrodes, which are arranged orthogonally thereto, can be employed for the tap-off of the Hall voltage. If a Hall effect sensor of this type is permeated by a magnetic field which is oriented perpendicularly to the semiconductor layer, and which is generated by the electric current flowing in the busbar, the Hall effect sensor delivers an output voltage which permits a conclusion to be drawn with respect to the current in the busbar. In particular, the electronic component for the measurement of current can detect the electric current in the busbar in a galvanically isolated or contactless manner. A current sensor module according to one example implementation can also be employed with differential Hall effect sensors, thereby enhancing robustness in response to magnetic interference fields. As an alternative to a Hall effect sensor, other electronic components for the measurement of current are possible, for example current sensors employing magnetoresistive effects, such as a giant magnetoresistive effect (GMR), an anisotropic magnetoresistive effect (AMR) or a tunnel magnetoresistive effect (TMR).

In the context of the present implementation, the term "encapsulation" can be particularly understood as a material which at least partially encloses the electronic component, which can be electrically insulating and preferably thermally conductive. The encapsulation can include, for example, an arbitrary potting compound. For example, the encapsulation can include a mold material. Alternatively, the encapsulation means can include a filling compound which is formed by casting.

In the context of the present application, the term "connecting hole" can be particularly understood as an insertion opening in the encapsulation or in the busbar, which can be configured for the introduction (e.g., insertion) of a corresponding press-fit element. A connecting hole of this type can be, for example, a blind hole or a through-hole. An internal diameter of the connecting hole, prior to press-fitting, can be smaller than an external diameter of the press-fit element, in order to permit a press-fit or clamping connection.

In the context of the present application, the term "press-fit element" can be particularly understood as a connecting element for the connection of the encapsulation to the busbar, which connection is formed by press-fitting into the connecting holes of the encapsulation and/or the busbar. The formation of a connection between the encapsulation and the busbar by the press-fit element can thus be executed using a press-fitting technique wherein, for example, a contact pin is pressed into a blind hole contact or a through-contact in the encapsulation or busbar. By the press-fitting of a pin surface or the intersection of pin edges in the encapsulation or busbar, a reliable and sustainable mechanical connection is formed. In particular, using a press-fit element, a press-fit connection with the encapsulation and the busbar can be formed. A press-fit connection of this type can be described as friction fit connection of the press-fit element to the encapsulation or the busbar. This connection can be configured, for example, by the mechanical clamping of an elastically or plastically deformable press-fit element. It is also possible, in the connection of a press-fit element to the encapsulation or busbar, for the phenomenon of thermal expansion to be employed. Thus, for example, the busbar, the encapsulation and the press-fit element can be assembled in a cooled state and then, further to heat-up to room temperature, are securely bonded by thermal expansion, on the grounds of the secure locking or compression associated with the expansion thereof. If, conversely, at least one of the above-mentioned elements is heated prior to the assembly thereof with the remaining elements, press-fitting is achieved using shrinkage.

In the context of the present application, the term "electromechanical connection apparatus for the transmission of a sensor signal" can particularly be understood as an apparatus which is configured for the connection of an electromechanical connection element, by way of a mating element, such that, using such connection, a mechanical and an electrical connection is simultaneously formed between the electromechanical connection apparatus and the electromechanical connection element. For example, the electromechanical connection apparatus can include at least one preferably funnel-shaped connecting bush into which, by way of an electromechanical connection element, a respective contact pin can be introduced. However, other electromechanical connection apparatuses are also possible. By the connection of the electromechanical connection apparatus to an electromechanical connection element, a sensor signal can be tapped-off from the electromechanical connection element.

Additional example implementations of the current sensor module, of electronic devices, of the application and of the method are described hereinafter.

According to one example implementation, the electrically insulating encapsulation can include two connecting holes for connecting to the busbar, and the current sensor module can include two press-fit elements for introduction into the connecting holes of the encapsulation and the busbar, in order to connect the encapsulation to the busbar. By the configuration of a multiple connection between the busbar and the current sensor module, associated with the employment of two or more press-fit elements, the long-term reliability of the connection, and thus the accuracy of current detection, can be further improved. For example, exactly two press-fit elements can be employed for connecting a busbar to a current sensor module, thereby resulting in a balanced relationship between connection complexity and the reliability of connection.

According to one example implementation, the at least one press-fit element can be selected from a group including at least one rivet, at least one beveled contact, at least one hot-caulked plastic dome and at least one press-fit element. A rivet can be understood as a plastically deformable, for example a cylindrical connection element. In a press-fit element, a greater expansion of the press-fit zone thereof, in comparison with the respective connecting hole, can be exploited. Using the press-fit process, a contact pin of the press-fit element can undergo plastic strain, thus permitting the achievement of a contact with high retention forces. In a beveled contact, the connection can be formed by beveling, for example using a chisel. A hot-caulked plastic dome can be caulked at a raised temperature, thereby resulting in strain of the plastic dome and the consequent formation of a stable connection with the encapsulation and/or the busbar. Hot caulking thus permits the formation of permanent form-fitted and interference-fitted (and, optionally, materially-bonded) connections.

According to one example implementation, the at least one press-fit element can include a deformable section which, for the connection of the busbar to the encapsulation in at least one further connecting hole of the busbar, is compressible transversely to an insertion direction of the at least one press-fit element. For example, the deformable section can be eyelet-shaped, and can be (particularly plastically or elastically) deformable in a lateral direction. A press-fit element of this type combines a low setting force with a high retention force.

According to one example implementation, the current sensor module can include a carrier, to which the electronic component is fitted. For example, the carrier can be a circuit board (printed circuit board or PCB), an IC (integrated circuit) substrate and/or a conductor frame structure. In this way, the current sensor module can be fitted in a positive manner, prior to encapsulation and, optionally, can also be electrically contact-connected.

According to one example implementation, the carrier can be partially encapsulated in the encapsulation and, at least at its underside, is released vis-à-vis the encapsulation. For example, at least one electrical contact of the carrier, which is coupled to the electronic component in an electrically conductive manner, can be released vis-à-vis the encapsulation, in order to permit the relaying of electrical sensor signals from the electronic component, preferably via an electromechanical connection apparatus of the current sensor module.

According to one example implementation, the current sensor module can include a circuit board, which is connected or connectable to the electronic component in an electrically conductive manner. In particular, the circuit board can be provided additionally to the above-mentioned carrier, and can be arranged entirely externally to the encapsulation. For example, the circuit board can be a PCB. The circuit board can be populated with one or more further electronic components, which can be configured, for example, for the further processing of sensor signals transmitted.

According to one example implementation, the current sensor module can include a plug-and/or-socket arrangement which, using a connecting cable, is configured for the electrically conductive coupling of the circuit board and the electronic component. An example implementation of this type is represented in FIG. 14. For example, a plug or a socket can be fitted to the circuit board, which can be coupled to the printed conductors and/or electronic components of the circuit board in an electrically conductive manner. Alternatively or additionally, a plug or a socket can be fitted to the encapsulation and/or to the carrier of the electronic component, which can be coupled to the at least partially encapsulated electronic component for the purposes of current measurement. The at least one socket and/or the at least one plug on the circuit board and/or the component can be interconnected using an electrical connecting cable. To this end, the electrical connecting cable can also be provided with at least one mating plug and/or with at least one mating socket. In this manner, using a flexible electrical connecting cable, the circuit board can be arranged in a structurally separate manner from the electronic component, the encapsulation and the busbar. An option which is conducive to freedom of design is provided accordingly.

According to one example implementation, the encapsulation can be secured on or above the circuit board. An example implementation of this type is represented, for example, in FIG. 1. The circuit board and the encapsulation can be rigidly connected to one another using at least one connection element, for example a spacer, thus forming a structural unit. The current sensor module can then be handled as a one-piece element.

According to one example implementation, the current sensor module can include a spacer for spacing the circuit board vis-à-vis the encapsulation. This spacer can simultaneously form the above-mentioned at least one connection element. Using the defined spacing of the busbar and the electronic component, on the one hand, and the circuit board on the other, any unwanted electromagnetic interaction between a current flux in the circuit board and the electronic component can be prevented, which might impair the accuracy of measurement of the electric current in the busbar by the electronic component. This arrangement is conducive to highly accurate current measurement.

According to one example implementation, the current sensor module can include at least one electromechanical connection apparatus, which is released vis-à-vis the encapsulation, for relaying a sensor signal which is detected by the electronic component. An electromechanical connection apparatus of this type permits measuring current-related signals which are detected using the electronic component to be made available to a peripheral electronic environment for further processing. The electromechanical connection apparatus can preferably include at least one connecting bush, into which at least one corresponding contact pin of an electromagnetic connection element can be introduced in a self-centering manner. Other types of electromechanical connection apparatuses are also possible, for example a plug or a socket.

According to one example implementation, the at least one electromechanical connection apparatus (for example, a connecting bush) can include at least one funnel-shaped or cone-shaped location channel for the accommodation of an electromechanical connection element. A funnel-shaped location channel for the accommodation of a contact pin or another electromechanical connection element permits a self-centering of the connecting bush and the contact pin in relation to one another, and also permits height equalization. Tolerances can be advantageously compensated as a result. If a user introduces a contact pin into the connecting bush in a longitudinal direction, the contact pin is automatically oriented in the transverse direction and the longitudinal direction, until a desired location position in the connecting bush is achieved. Moreover, a mechanical and an electrical connection can be formed simultaneously. This configuration is simple and error-resistant.

According to one example implementation, the current sensor module can include the at least one electromechanical connection element for electromechanical connection to the at least one electromechanical connection apparatus. Preferably, a plurality of such electromechanical connection elements can be mutually combined to form a single connection unit, which can be handled in combination, and which can introduced as a whole into a corresponding assembly of electromechanical connecting bushes or similar. This enhances user convenience for the installation of the current sensor module.

According to one example implementation, the at least one electromechanical connection element can be an electromechanical press-fitting element, particularly a press-fit element. The press-fit element of the electromechanical connection element can be configured, for example, as described above for the at least one press-fit element for the connection of the busbar and the encapsulation. Advantageously, a respective electromechanical connection element can be press-fitted into a respective metal-lined through-contact in the circuit board, for the simultaneous formation of an electrical and a mechanical contact with the circuit board. In this way, sensor signals from the electronic component for the measurement of current in the busbar can be transmitted to the circuit board in a simple and reliable manner. In the circuit board, for example, these current signals can be evaluated or can undergo further processing.

According to one example implementation, the at least one electromechanical press-fit element can include a deformable section which, in at least one connection bushing of a circuit board, is compressible transversely to an insertion direction of the press-fit element. For example, the deformable section can be eyelet-shaped, and can be (particularly plastically or elastically) deformable in a lateral direction. A press-fit element of this type combines a low setting force with a high retention force.

According to one example implementation, the at least one electromechanical press-fit element, on another section which is arranged opposite the deformable section, can include a contact pin which is inserted or insertable into the electromechanical connection apparatus.

According to one example implementation, the at least one electromechanical connection element can be inserted or is insertable into at least one connection bushing in the circuit board. This is preferably achieved using the above-mentioned deformable section.

According to one example implementation, the electromechanical connection element can be configured for the transmission of a sensor signal which is detected by the electronic component from the at least one electrical connection apparatus to the at least one connection bushing of the circuit board. A sensor signal can thus be transmitted from the electronic component, optionally via a carrier of the electronic component, and via the electromechanical connection apparatus and the associated electromechanical connection element to the circuit board.

According to one example implementation, the current sensor module can be arranged in a taper of the busbar. Clearly, using a lateral constriction of the busbar in the region of fitting of the current sensor module, the electric current flowing along the busbar can be concentrated at the taper, and the magnetic field thus generated is spatially focused at the location of the current sensor module. As a result, a high degree of measuring accuracy of electric current can be achieved by the current sensor module, without the necessity for a flux-concentrating magnetic field core.

According to one example implementation, a main extension direction of the current sensor module can be oriented along a main extension direction of the busbar. In other words, a main extension direction of the busbar can coincide with a main extension direction of the current sensor module. A main extension direction can thus correspond to a dimension of the busbar or the current sensor module having the greatest expansion. In an example implementation of this type, as represented, for example, in FIG. 2, a particularly compact current sensor module can be achieved.

According to a further example implementation, a main extension direction of the current sensor module can be rotated vis-à-vis a main extension direction of the busbar (see FIG. 4, for example). Again in this case, a main extension direction can correspond to a dimension of the busbar or the current sensor module having the greatest expansion. Clearly, in the configuration described, a main extension direction of the current sensor module and a main extension direction of the busbar can enclose an angle which differs from zero, particularly an acute angle. For example, an angle of rotation can be no greater than 45°. In a rotated arrangement between the current sensor module and the busbar, it can advantageously be possible for any unwanted crosstalk to be at least partially offset. Measuring accuracy of electric current in the busbar can be further enhanced as a result.

According to one example implementation, the electronic device can include an inverter circuit, to which the busbar is electrically coupled. An inverter or power inverter can be a circuit which converts a DC voltage into an AC voltage. An inverter circuit (or converter circuit) of this type can be employed, for example, in an engine control system of a vehicle. An inverter circuit can thus be particularly advantageous for motor vehicle applications.

For the three-phase operation of an engine control system or engine regulation system, a separate magnetic coreless current sensor module having the above-mentioned features can particularly be provided for each phase of the busbar. Current flowing in the busbar can then be detected separately for each phase, and the result of measurement employed for engine control or engine regulation.

According to one example implementation, a connection of the encapsulation to the busbar, and particularly the entire electronic device, can be screwless, e.g., executed without connecting screws. If no screws are employed for the connection of the encapsulation and the busbar, any unwanted metal abrasion of screws can be prevented which might influence magnetic field-based current measurement by the electronic component in an unwanted manner. Moreover, by the connection of the encapsulation to the busbar exclusively using one or more press-fit elements, any unwanted loosening of this connection over time, of the type which can be associated with the use of screws, can be prevented. By the prevention of the loosening of the connection between the encapsulation and the busbar it can advantageously be ensured that the sensor characteristic remains constant over time.

According to one example implementation, the current sensor module can be arranged on only one of two opposing main surfaces of the busbar, and the encapsulation is connected or connectable to the busbar from the other of the two main surfaces, using the at least one press-fit element. In this context, the term main surfaces can be understood as two mutually opposing large surface of a, for example, strip-shaped or plate-shaped busbar. If the entire current sensor module is fitted to the busbar on one side only, this facilitates installation and reduces the structural space required. The opposing main surface of the busbar can then be left clear. This permits simple installation, and facilitates retrofitting.

A differential sensor layout provides a characteristically intrinsic stray field robustness for sensor implementation.

BRIEF DESCRIPTION OF THE DRAWINGS

Example implementations are represented in the figures, and are described in greater detail hereinafter.

In the figures:

FIG. 4 shows an overhead view of an electronic device having a magnetic coreless current sensor module and a busbar, according to another example implementation.

FIG. 5 shows a busbar for an electronic device, according to one example implementation.

FIG. 6 shows a busbar for an electronic device, according to another example implementation.

FIG. 7 shows a press-fit element, which is configured in the form of a press-fit element for a magnetic coreless current sensor module, according to one example implementation.

FIG. 8 shows a press-fit element, which is configured in the form of a rivet for a magnetic coreless current sensor module, according to another example implementation.

DETAILED DESCRIPTION

Figure 1:
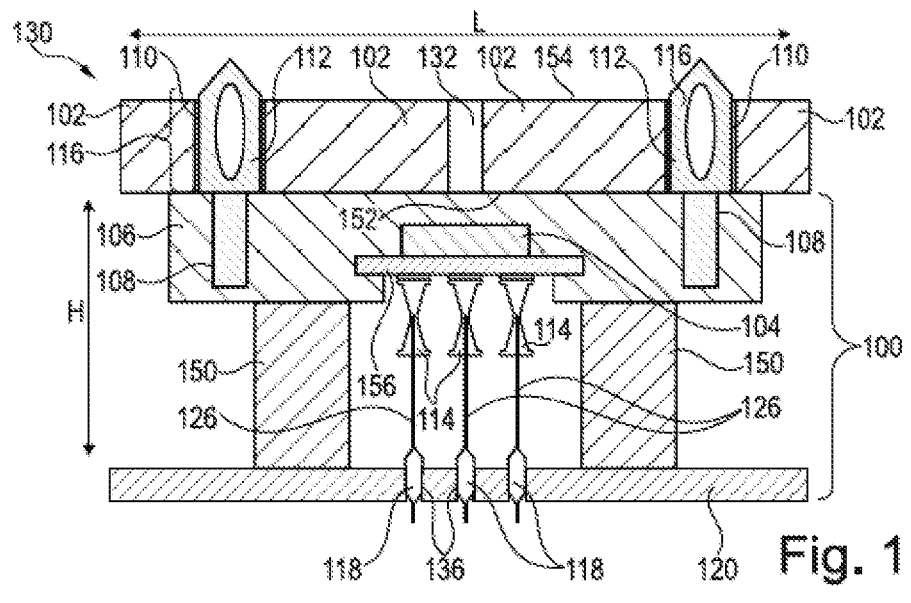
FIG. 1 shows a cross-sectional view of an electronic device having a magnetic coreless current sensor module and a busbar, according to one example implementation.

Identical or similar components in different figures are identified by the same reference numbers.

Before example implementations are described with reference to the figures, a number of further general considerations will be explained, based on which example implementations have been developed:

Current measurement is a key field of application for numerous technical functions. This applies particularly with regard to the electrification of vehicle drive systems, including applications such as scooters, two-wheeled vehicles and four-wheeled vehicles.

In particular, current sensors are employed in battery monitoring systems, current distribution systems, battery isolating switches, electrical fuses, power inverters, etc.

For high-current applications and/or applications which require galvanic isolation between a conductor which carries a test current and a current sensor output, magnetic current sensors are employed. These devices detect the test current indirectly, in that they measure the magnetic flux density which is generated by the test current. Conventional implementations of magnetic current sensors employ an iron core as a field concentrator, which is arranged around the conductor which carries the test current. The flux density in the field concentrator is dependent upon the test current. The relative permeability of the iron core executes a flux density amplification. A linear detecting element (for example, a linear Hall effect sensor) measures the magnetic flux which is generated by the test current, and thus delivers a galvanically isolated output signal which represents the test current. Other implementations of magnetic core-based sensors compensate the flux density which is generated by the test current using a compensating winding. In this case, the measuring probe regulates the resulting flux density to a constant value (for example zero), whereas the compensating current is proportional to the test current.

While the basic design of magnetic core-based sensors is relatively simple, these implementations have disadvantages: these include the substantial size and the substantial weight of the magnetic core. Additionally, non-linearity errors can occur, which can be caused by saturation effects. Moreover, offset errors can occur, which can be caused, for example, by remanence effects of the magnetic core.

Magnetic coreless or magnetic core-free current sensors operate without the use of field concentrators, e.g., with no magnetic core. Conversely to magnetic core-based implementations, these sensors execute the direct measurement of the flux density generated by the test current. By the exclusion of an iron core, the above-mentioned disadvantages can be mitigated, or even entirely eliminated. However, the available flux density on the sensor elements is reduced. Consequently, sensor elements should be arranged as close as possible to the conductor. As current sensors are frequently operated in an EMI—(electromagnetic interference) critical environment (particularly in power electronics), the implementation of a differential sensor layout is advantageous, which delivers intrinsic stray field immunity in response to interference fields which are generated by adjoining elements (for example semiconductors, capacitors, inductances or electrical conductors).

Typical coreless implementations therefore comprise a sensor structure for the generation of a differential magnetic flux. Moreover, a thin insulating layer can be provided between the sensor elements and the primary conductor.

Magnetic coreless current sensor solutions can be implemented in a variety of ways:

Integrated Current Rail (iCR) solutions, with an integrated conductor rail, are based upon a combination of a primary conductor, galvanic isolation and a field sensor in a housing. These implementations require current to be injected into the sensor package and, in consequence, the maximum current capacity is limited by the current processing capacity of the housing and by the maximum permissible current density in the power wiring system (for example, a circuit board) which is employed for the connection of the current sensor to the current circuit.

In an external Current Rail (eCR) implementation, the test current can remain in a routing system (PCB, power inlay, busbar, etc.). The conductor is modified, such that an appropriate detection field is generated, which can be detected by the (particularly differential) field probe. Depending upon the routing system and the sensor integration method, it is possible for sensor solutions with scale ranges from 100 A up to several kA to be implemented.

External Current Rail implementations, based upon differential field probes, provide high-precision current measurement solutions in combination with low power losses. Disadvantages include the complex construction and finishing process for the end user (for example, FEM (finite element method) simulations for design purposes, the alignment of sensors in relation to the wiring system, insulation coordination, sensor calibration). Consequently, eCR solutions are attractive for high-volume applications (for example, motor vehicle applications) which require efficient production. For applications involving lower volumes, or diversified applications, sensor implementations involving pretested and calibrated sensors are preferred on the grounds of user-friendliness and simplified installation requirements.

In consideration of limited installation space, a magnetic coreless retrofit module for the replacement of magnetic core-based sensors would be desirable. A sensor module is therefore desirable which is compatible with conventional busbar structures and is universally employable.

According to one example implementation, a universal magnetic coreless current sensor module is provided, which is adaptable to various conventional structures and forms of buses or busbars. An example implementation is represented in FIG. 1 and is described in greater detail hereinafter. An example implementation of this type provides a universal magnetic coreless current sensor module which is appropriate for busbars of numerous different configurations which are conventionally employed.

According to one example implementation, a (particularly magnetic field measurement-based) current sensor module can be connected to a high-current busbar, in order to measure current flowing in the busbar in service with a high degree of accuracy and limited complexity. Advantageously, such a current sensor module can be magnetic core-free, and thus configured in a compact manner. By the fitting of the current sensor module to only one main surface of the busbar, simple installation is permitted. A current sensor module of this type can be universally fitted to busbars of different geometries, and is also particularly appropriate for the retrofitting of existing busbars with a current measurement function. Advantageously, fitting of the busbar to the current sensor module can be executed by the employment of a press-fit element, as a result of which abrasion-free fitting, and thus corruption-free current measurement can be ensured. In many cases, particles produced by abrasion are magnetic or magnetizable, and can therefore influence and corrupt the magnetic field measured on the sensor element. Moreover, by the formation of a press-fit connection between the current sensor module and the busbar, a permanent and consistent spatial relationship between the current sensor module and the busbar is established, thereby reducing positional tolerances and ensuring high-precision current measurement over a prolonged period. Accordingly, a magnetic coreless current sensor module according to one example implementation is also particularly appropriate for motor vehicle applications, which require excellent reliability. A further advantage is provided by the accessibility of a sensor signal from the current sensor module on an electro-mechanical connection apparatus. From the latter, the sensor signal can be tapped-off for further processing or evaluation in a simple manner. Preferably, but not compulsorily, an electromechanical connection apparatus of this type can be configured in the form of one or more connecting bushes, which can advantageously assume a funnel-shaped design.

According to one example implementation, a magnetic coreless current sensor module can therefore be provided which is employable for the replacement of magnetic core-based current sensors, and is particularly appropriate for retrofitting. A current sensor module according to the example implementations provides the advantage of limited complexity of manufacture, with a simultaneously adaptive design (IC, PCB, press-fit pins, molded housing). Example implementations therefore provide greater flexibility than magnetic core-based current sensors. This proceeds from the universal facility for the integration of different busbar designs into the architecture of a current sensor module, according to one example implementation. A magnetic coreless current sensor module of this type is simple to install, wherein, for example, two press-fit contacts with the busbar and six press-fit contacts with the circuit board are employed. As a result, advantageously, screws for the fitting of the current sensor module according to one example implementation can be omitted.

The design of a current sensor module according to one example implementation is compatible with busbars of different forms and stamping configurations: for example, according to an example design rule, the size of a connecting hole in the busbar can be no smaller than the maximum thickness of the busbar (which can be based upon a stamping rule for copper, which is to be considered according to one example implementation). The material of the press-fit element should preferably not be magnetic. It is further preferred if the at least one press-fit element exerts a sufficiently low setting resistance. Optionally, in the installed state, the current sensor module can be rotated relatively to the busbar through an angle of up to 45°, in order to entirely or partially reduce crosstalk (e.g., any unwanted interaction between signals and/or currents transmitted on the various conductors or busbars). This reduction is beneficial, for example, if individual phases of a motor are routed adjacently, as represented, for example, in FIG. 13. It can then occur that a current sensor measures magnetic fields from a plurality of phases simultaneously. In this case, reference is made to crosstalk of the magnetic field from a first phase to a current sensor of a second phase. A permanent connection between the busbar (also described as a bus) and the magnetic coreless current sensor module can be executed, for example, using press-fit contacts or rivets (for example of copper).

A connection of the current sensor module according to one example implementation and a circuit board, incorporating a spacing adjustment of the busbar vis-à-vis the circuit board, can advantageously be executed using press-fit contacts and funnel-shaped connecting bushes (or other electromechanical connection apparatuses) which, upon assembly, can also deliver characteristic tolerance compensation in one, two, or all three spatial directions.

For the purposes of height adjustment, for example, press-fit contacts of different lengths can be employed. Press-fit contacts can be provided with limited complexity, are simple to install, and permit tolerance equalization over a long service life.

According to one example implementation, an intelligent implementation of a magnetic coreless current sensor is provided by way of a retrofit option. The configuration of a magnetic coreless current sensor module according to one example implementation is appropriate to numerous conventional shapes and sizes of conductor rails. Encapsulating an electronic sensor component using an encapsulation permits the achievement of reliable electrical insulation properties.

In particular, according to one example implementation, a press-fit plug connector can be connected to the busbar and a gate driver board, in order to offset installation and spacing tolerances between the module and the gate driver board.

In particular, magnetic coreless current sensor modules according to example implementations can be employed in power inverters having a busbar. Examples include main inverters for the motor vehicle industry, industrial inverters and inverters for trains or other rail vehicles.

FIG. 1 shows a cross-sectional view of an electronic device 130 having a magnetic coreless current sensor module 100 and a busbar 102, according to one example implementation.

The magnetic coreless current sensor module 100 of the electronic device 130 according to FIG. 1 is employed for the measurement of an electric current flowing in a busbar 102 and is free of any magnetic flux concentrator. The current sensor module 100 can therefore assume a compact design. The busbar 102 moreover forms a section of the electronic device 130 and is fitted to the current sensor module 100. For example, the busbar 102, which can also be described as a conductor rail, can be configured in the form of a flat stamped metal plate, for example of copper.

FIG. 1 shows that an encapsulation 106 of the current sensor module 100 is provided, having connecting holes 108 which, in the example implementation represented, are configured as blind holes. The encapsulation 106 can be, for example, an arbitrary potting compound, particularly a mold compound. In a corresponding manner, the busbar 102 is provided with further connecting holes 110, which are configured for connecting to the current sensor module 100. In the example implementation represented, the further connecting holes 110 are through-holes, which extend through the full thickness of the busbar 102.

Advantageously, the encapsulation 106 of the current sensor module 100 and the busbar 102 are mutually connected by the introduction of mechanical press-fit elements 112 into the connecting holes 108 of the electrically insulating encapsulation 106, and into the further connecting holes 110 of the busbar 102. Preferably, but not compulsorily, the press-fit elements 112 are formed of the same material (for example copper) as the busbar 102, in the interests of the optimum emulation of the material of the busbar 102. In other words, using the above-mentioned measures, the properties of a busbar which is free from any further connecting holes can be emulated, with respect to the electrical and/or mechanical properties thereof. Advantageously, mechanical stresses associated with different expansion coefficients can thus be reduced, or even eliminated. In the example implementation represented, the press-fitting elements 112 are configured in the form of press-fit elements. For the purposes of connection, the current sensor module 100, which is described in greater detail hereinafter, is arranged on only one main surface of the busbar 102 such that each connecting hole 108 is respectively oriented or aligned with one of the further connecting holes 110. A respective press-fit element 112 can be introduced into a pair of mutually oriented connecting holes 108, 110, thus providing a press-fit connection between the busbar 102 and the current sensor module 100. The connection between the busbar 102 and the current sensor module 100 can thus be advantageously configured in the form of press-fit connections.

Moreover, from an underside of the encapsulation 106, a plurality of electromechanical connection apparatuses 114 extend downwards in a mutually parallel arrangement. The electromechanical connection apparatuses 114 are electrically coupled to the electronic component 104 using a carrier 156. Advantageously, according to FIG. 1, the electromechanical connection apparatuses 114 are open at their lower end and are configured in the form of downwardly extending funnel-shaped connecting bushes. Into each of the funnel-shaped connecting bushes, a respective electromechanical connection element 126 can be introduced, in order to connect the connecting bushes to a circuit board 120. The electromechanical connection elements 126 are provided with pins at one end, which plug into the connecting bushes. At their opposing other end, the electromechanical connection elements 126 comprise a deformable section 118, which is press-fitted into metal-lined connecting bushings 136 in the circuit board 120. A press-fit connection is thus formed between the connection elements 126 and the circuit board 120. The connection elements 126 are mechanically and electrically coupled to the circuit board 120 by the connection.

The electromechanical connection elements 126 can thus be configured in the form of press-fit elements which are configured for electromechanical press-fitting. A press-fit element of this type comprises a deformable section 118, which is compressible into an associated connecting bushing 136 in the circuit board 120, wherein the deformable section 118 is compressible transversely to an insertion direction of the press-fit element. In addition to its mechanical connection function, the electromechanical connection element 126 is also employed for the transmission of an electrical sensor signal which is detected by the electronic component 104 from the electrical connection apparatus 114 to the respective connecting bushing 136 of the circuit board 120.

The current sensor module 100 contains the electronic component 104 which is configured for the measurement of current in the busbar 102. The electronic component 104 is fitted to the carrier 156, for example a circuit board substrate or a conductor frame structure. The electronic component 104 can be a Hall effect sensor. Advantageously, the electronic component 104 can be configured in the form of a semiconductor chip. Electric current in the busbar 102 clearly generates a magnetic field in the surrounding region of the busbar 102, which is characteristic of the electric current. This magnetic field can be measured using the electronic component 104. The measurement signal from the electronic component 104 is therefore indicative of the electric current in the busbar 102.

As represented in FIG. 1, the electronic component 104 is entirely embedded in the electrically insulating encapsulation 106, whereas the carrier 156 is only partially embedded. As a result, the electronic component 104 is electrically insulated from its environment, and is protected against mechanical damage. In order to bring the electronic component 104 into proximity with the busbar 102, the electrically insulating encapsulation 106 is provided with the above-mentioned connecting holes 108 for connecting to the busbar 102. The closer the spatial proximity of the electronic component 104 to the busbar 102, the greater the sensitivity thereof for the measurement of electric current in the busbar 102.

The press-fitting elements, configured in the form of press-fit elements 112, as described above, are employed for the connection of the encapsulation 106 to the busbar 102 using the introduction of the press-fit elements 112 into the connecting holes 108 of the electrically insulating encapsulation 106 and into the further connecting holes 110 of the busbar 102. Advantageously, the above-mentioned press-fit connection eliminates the use of screws. As a result, any highly undesirable formation of metal chips or similar can be prevented, which might affect the accuracy of current measurement. Metal particles produced by abrasion, on the grounds of their magnetic properties, might influence the magnetic field at the location of the electronic component which is employed for current measurement in an undesirable manner, potentially resulting in the corruption of current measurement. It is particularly advantageous that the above-mentioned press-fit connection between the encapsulation 106 and the busbar 102, even in the long-term duty of the current sensor module 100, ensures the maintenance of a strictly consistent spatial relationship between the busbar 102 and the current sensor module 100, which is conducive to high-precision current measurement. Comparable reliability of the service life of the current sensor module 100 cannot typically be achieved using a screw connection.

The configuration of the electromechanical connection apparatus 114 in the form of funnel-shaped connecting bushes, which project from the encapsulation 106, permits a simple relaying of the electrical sensor signal which is detected by the electronic component 104. In other words, sensor signals can be tapped-off from the funnel-shaped connecting bushes and routed via the electrically conductive electromechanical connection elements 126 of the circuit board 120 for further process. The circuit board 120 is thus coupled to the electronic component 104 in an electrically conductive manner.

FIG. 1 further shows that the encapsulation 106 is secured using the circuit board 120. To this end, at least one spacer 150 is connected to the circuit board 120 on one side, and to the encapsulation 106 on the other side. For example, the spacer 150 can be a spacing ring or an arrangement of spacing columns. Using the spacer 150, a target clearance can be maintained between the circuit board 120 and the electronic component 104. The function of the spacer 150 is the reliable positioning of the deformable sections 118 vis-à-vis the connecting bushings 136 which are configured, for example, in the form of bores, transversely to the insertion direction. In consequence, the spacer 150, in combination with a plane-parallel encapsulation 106, delivers a positive positioning of the electronic component 104 relative to the busbar 102, which additionally reduces any errors in the sensor signal associated with any installation tolerances which might otherwise be possible.

Advantageously, the current sensor module 100 represented in FIG. 1 is arranged on only one of the two opposing main surfaces 152, 154, namely, on the main surface 152 of the busbar 102. This restricts the requisite structural space, and is conducive to the simple retrofitting of a busbar 102 with a current sensor module 100.

For example, the current sensor module 100 can be fitted to the lower main surface 152 of the busbar 102 such that a respective connecting hole 108 is axially oriented with a respective connecting hole 110. A respective press-fit element 112 is or can be press-fitted into the stepped arrangement of the two oriented connecting holes 108, 110. The busbar 102 and the current sensor module 100 are mutually connected accordingly. In accordance with the stepped arrangement of two mutually oriented connecting holes 108, 110 the press-fit element 112 can also be configured with a stepped design. For the purposes of fitting, it is also possible for the press-fit element 112 to be firstly introduced into the connecting hole 108 of the encapsulation 106, such that the deformable section 116 projects upwardly from the encapsulation 106. The busbar 102 can then be fitted onto the deformable sections 116 such that the deformable sections 116 are press-fitted into the further through-holes 110 of the busbar 102.

Advantageously, the above-mentioned current sensor module 100 or the above-mentioned electronic device 130, on the grounds of their high reliability and their high accuracy of measurement, can be particularly employed in a motor vehicle application. Moreover, the above-mentioned magnetic coreless current sensor module 100 is particularly appropriate for the retrofitting of a busbar 102 with the former.

The electronic device 130 represented in FIG. 1 is of a compact design. A height H of the current sensor module 100 above the circuit board 120 can lie, for example, in a range of 3 mm to 18 mm. A length L of the current sensor module 100 can be, for example, 24 mm. Only a section of the busbar 102 is represented in FIG. 1.

Figure 2:
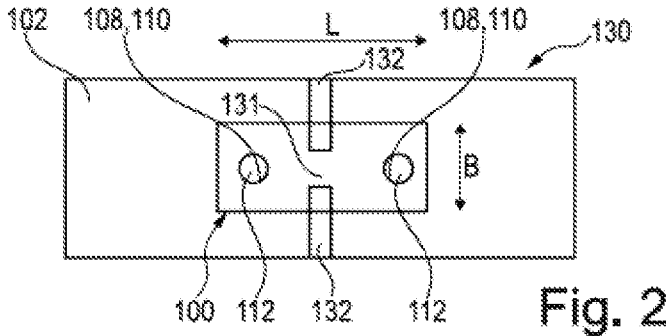
FIG. 2 shows an overhead view of an electronic device having a magnetic coreless current sensor module and a busbar, according to one example implementation.

FIG. 2 shows an overhead view of an electronic device 130 having a magnetic coreless current sensor module 100 and a busbar 102, according to one example implementation.

The current sensor module 100 according to FIG. 2 can be configured in the manner described with reference to FIG. 1. A width of the current sensor module 100 is indicated by B.

It is further represented in FIG. 2 that the current sensor module 100 is arranged at a taper 131 in the busbar 102. The busbar 102 can evidently be configured in the form of an essentially rectangular metal strip which, at a fitting position of the current sensor module 100, on both mutually opposing longitudinal sides, is provided with a transverse slot 132, to form the taper 131. By the formation of the taper 131, electric current flowing in the longitudinal direction of the busbar 102 is locally constricted at the taper 131 such that, in the region of the taper 131, a magnetic field generated is particularly strong. This improves the accuracy of current measurement by the magnetic Hall effect sensor in the form of the electronic component 104, which can be arranged directly above or below the taper 131.

It is further represented in FIG. 2 that the main extension direction of the rectangular current sensor module 100 is oriented along a main extension direction of the rectangular busbar 102. In other words, according to FIG. 2, the main extension directions of the current sensor module 100 and the busbar 102 coincide.

Figure 3:
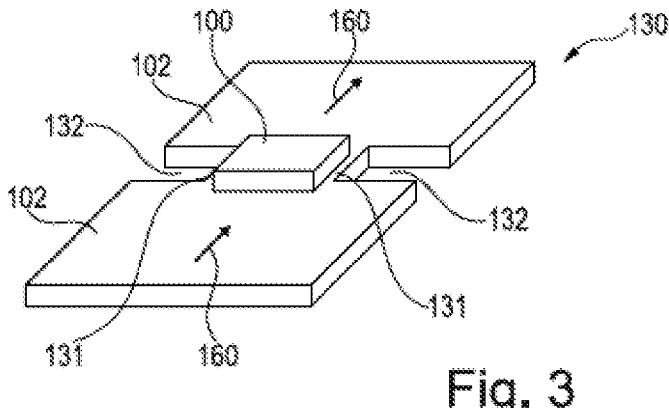
FIG. 3 shows a three-dimensional view of an electronic device having a magnetic coreless current sensor module and a busbar, according to one example implementation.

FIG. 3 shows a three-dimensional view of an electronic device 130 having a magnetic coreless current sensor module 100 and a busbar 102, according to one example implementation. A direction of flow of electric current in the busbar 102 is represented in FIG. 3 by the reference number 160.

Figures 4, 5, 6, 7, 8:
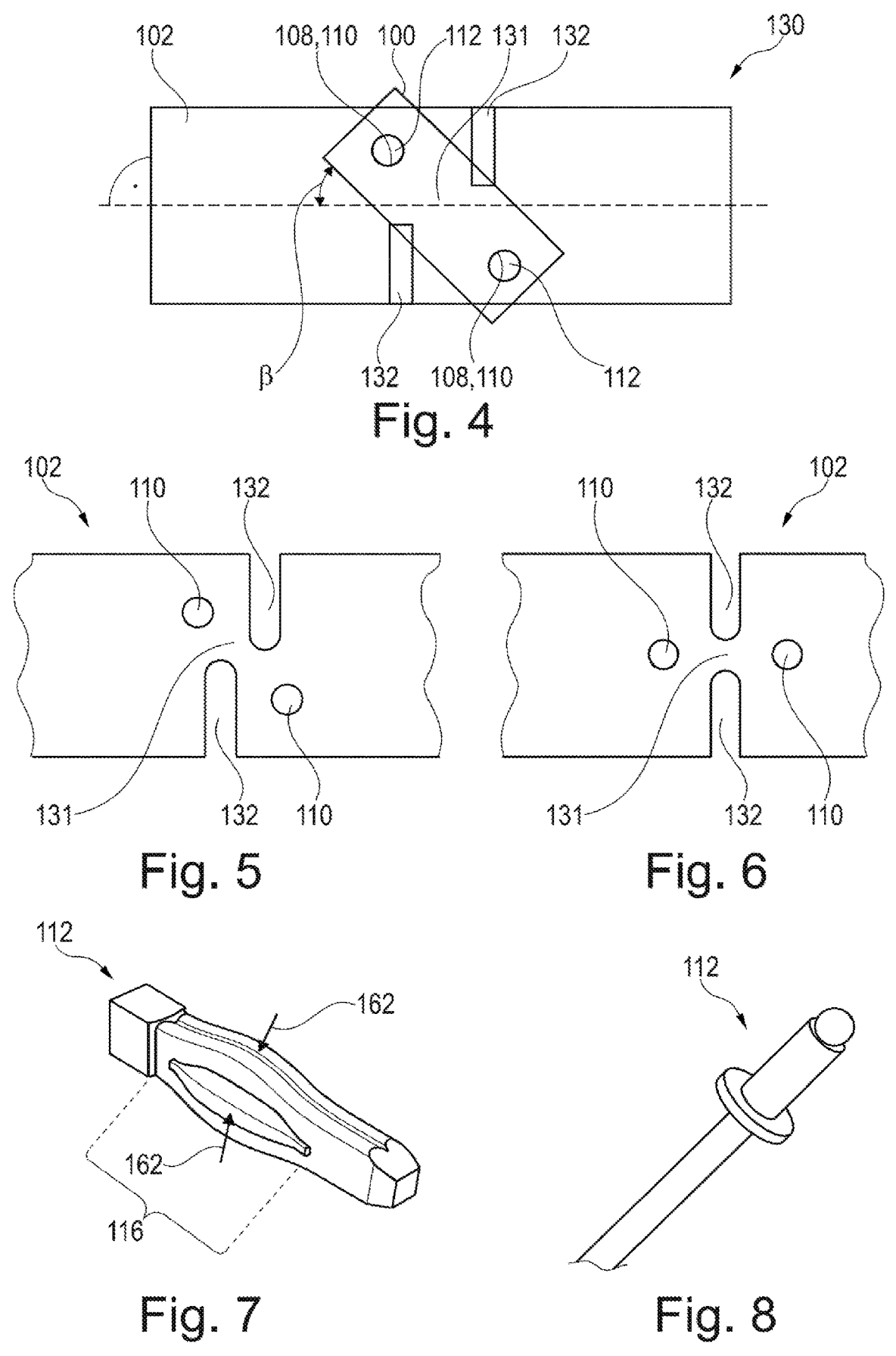

FIG. 4 shows an overhead view of an electronic device 130 having a magnetic coreless current sensor module 100 and a busbar 102, according to another example implementation.

The example implementation according to FIG. 4 particularly differs from the example implementation according to FIG. 2 in that, according to FIG. 4, a main extension direction of the rectangular current sensor module 100 encloses an angle β with a main extension direction of the rectangular busbar 102 which differs from zero. For example, the angle β can lie between 10° and 45°. Thus, according to FIG. 4, the main extension direction of the current sensor module 100 is arranged with a rotation vis-à-vis the main extension direction of the busbar 102. In order to position the taper 131 directly above or directly below the electronic component 104 of the current sensor module 100, the transverse slots 132 in the busbar 102 according to FIG. 4 are laterally offset in relation to one another. In the rotated arrangement according to FIG. 4, an advantageous compensation of unwanted crosstalk phenomena can be achieved, thus enhancing the accuracy of measurement of electric current flowing in the busbar 102. Using the rotated arrangement, any unwanted interaction between signals and/or currents which are transmitted on different conductors or busbars can be entirely or partially eliminated.

FIG. 5 shows a busbar 102 for an electronic device 130 according to one example implementation. FIG. 6 shows a busbar 102 for an electronic device 130 according to another example implementation. By reference to FIG. 5 and FIG. 6, it can be seen that, for different geometries of busbar 102, the same type of current sensor module 100 is universally employable. For the purposes of adaptation to a specific busbar geometry, an appropriate dimensioning of the current sensor module 100 and, in particular, an appropriate arrangement of connecting holes 108 (not visible in FIG. 5 and FIG. 6) and the associated press-fit elements 112 can suffice. FIG. 5 and FIG. 6 additionally show that the further connecting holes 110 and the taper 131 can be mutually tailored such that, notwithstanding a differing busbar geometry, an identical current sensor module 100 or an otherwise identical device 130 can be employed. This can reduce complexity of manufacture, as parts can be produced in large numbers, and any adaptation to the busbar 102 remains limited.

The geometry of the busbar 102 according to FIG. 5 is similar to that represented in FIG. 4 wherein, according to FIG. 5, the transverse slots 132 are rounded at their inner side. The geometry of the busbar 102 according to FIG. 6 is similar to that represented in FIG. 2 wherein, according to FIG. 6, the transverse slots 132 are rounded at their inner side. Whereas, according to FIG. 5, the transverse slot 132 are laterally offset in relation to one another, the transverse slots 132 according to FIG. 6 coincide, or are mutually axially oriented. Between the transverse slots 132, according to FIG. 5 and according to FIG. 6, an approximately equal clearance for the current flux is formed. Thus, according to FIG. 5 and FIG. 6, the constriction of current flux occurs on the electronic components 104 (not represented in FIG. 5 and FIG. 6) which are to be arranged in the region of the taper 131, and sensors with similar properties can be employed accordingly.

FIG. 7 shows a press-fitting element configured in the form of a press-fit element 112 for a magnetic coreless current sensor module 100 according to one example implementation.

The press-fit element 112 represented in FIG. 7 can be formed, for example, of bronze ($CuSn_4$). A press-fit element 112 of this type disturbs neither the current flux nor the magnetic field in any significant manner. The press-fit element formed of bronze comprises a deformable section 116 which, for the connection of the busbar 102 to the encapsulation 106 in at least one further connecting hole 110 of the busbar 102, is compressible transversely to an insertion direction of the at least one press-fit element. This is represented by the reference numbers 162.

FIG. 8 shows a press-fit element 112 configured in the form of a rivet for a magnetic coreless current sensor module 100 according to another example implementation. Fitting of the rivet executes plastic deformation, thus forming an undercut which ensures the application of strong retention forces to the inserted structure.

Figures 9, 10, 11, 12:
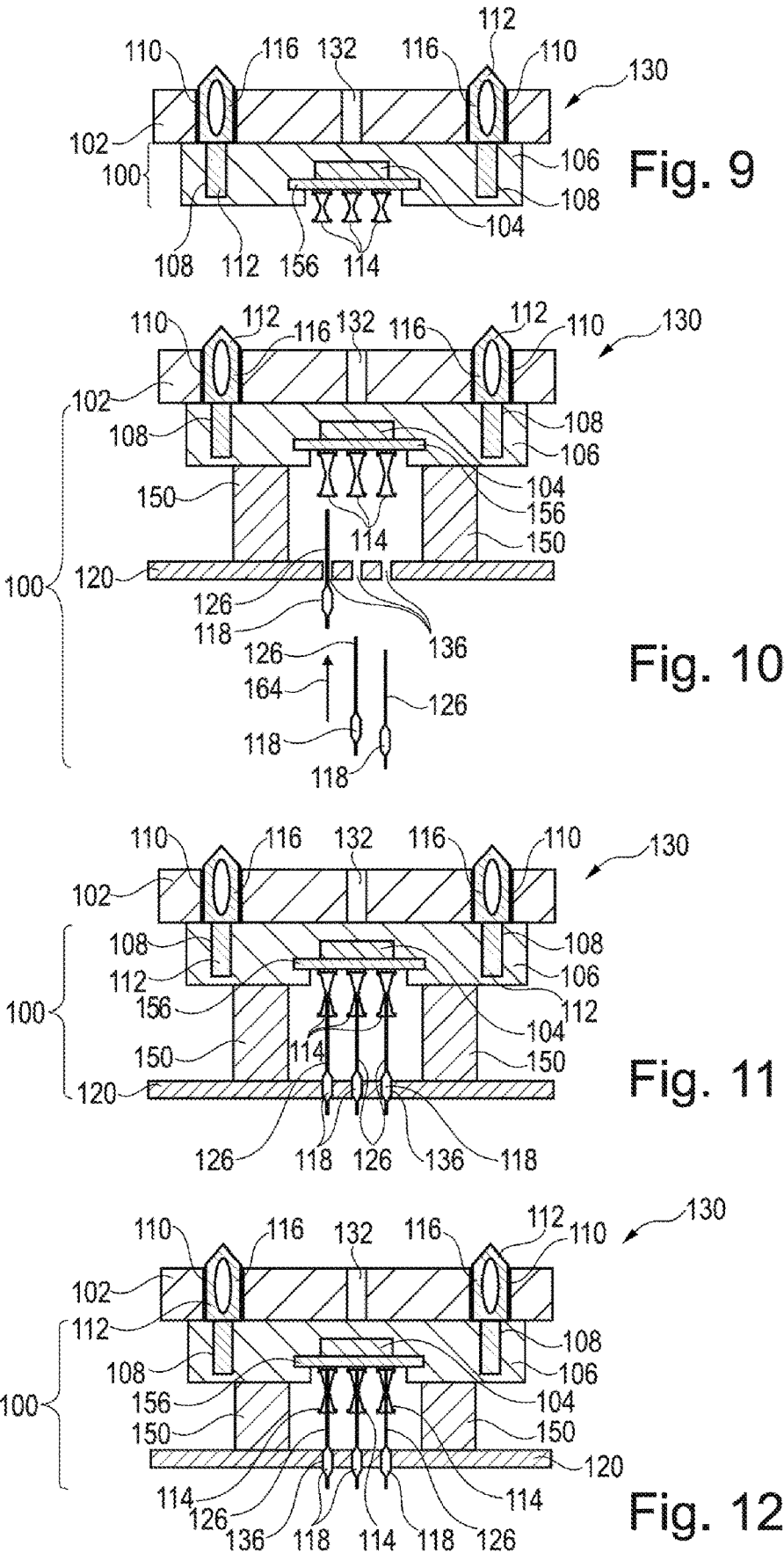
FIGS. 9 to 11 show various cross-sectional views during the fitting of an electronic device having a magnetic coreless current sensor module and a busbar, according to one example implementation.
FIG. 12 shows a cross-sectional view of an electronic device according to another example implementation, which differs from that represented in FIG. 11 with respect to structural height.

FIGS. 9 to 11 show various cross-sectional views during the fitting of an electronic device 130 having a magnetic coreless current sensor module 100 and a busbar 102, according to one example implementation.

With reference to FIG. 9, using the press-fit element 112, the encapsulation 106 is firstly connected to the busbar 102.

With reference to FIG. 10, the circuit board 120, using the optional spacers 150, can then be fitted with a definable clearance to the encapsulation 106 and to the downwardly projecting electromechanical connection apparatuses 114, vis-à-vis the underside of the encapsulation 106. Thus, as represented in FIG. 10 by reference number 164, the metallic electromechanical connection elements 126 can then be led through the connecting bushings 136 in the circuit board 120. The exposed front-side pin-shaped sections of the electromechanical connection elements 126 are firstly led through the connecting bushings 136. The rear-side bush-shaped deformable sections 118 of the connection elements 126 initially remain below the circuit board 120.

With reference to FIG. 11, from the position represented in FIG. 10, the electromechanical connection elements 126 are compressed further upwards through the circuit board 120, until the exposed ends of the pin-shaped sections of the electromechanical connection elements 126 engage in the funnel-shaped and upwardly tapering location openings of the electromechanical connection apparatuses 114, which are configured in the form of connecting bushes. The funnel-shaped insertion channels of the connection apparatuses 114 ensure the self-centering of the connection elements 126 and also execute a height and/or tolerance equalization, for example in consideration of spacers 150 of different sizes, or in the event of component tolerances. In this manner, by the cooperation of the connection apparatuses 114 and the connection elements 126, a height or tolerance equalization is executed, as also described with reference to FIG. 12.

The fitting process is complete, when the deformable sections 118 of the connection elements 126 have been press-fitted into the metal-lined connecting bushings 136 of the circuit board 120. The mechanical and electrical connection between the constituent elements of the electronic device 130 is completed accordingly.

FIG. 12 shows a cross-sectional view of an electronic device 130 according to another example implementation, which differs from that represented in FIG. 11 with respect to structural height. In FIG. 12, an alternative electronic device 130 is thus represented, in which the spacer 150 is configured with a shorter length than that represented in FIG. 11. The height equalization thus required is executed by the connecting bushes of the connection apparatuses 114 which, according to FIG. 12, accommodate a longer section of the connection elements 126 than that represented in FIG. 11.

Figure 13:
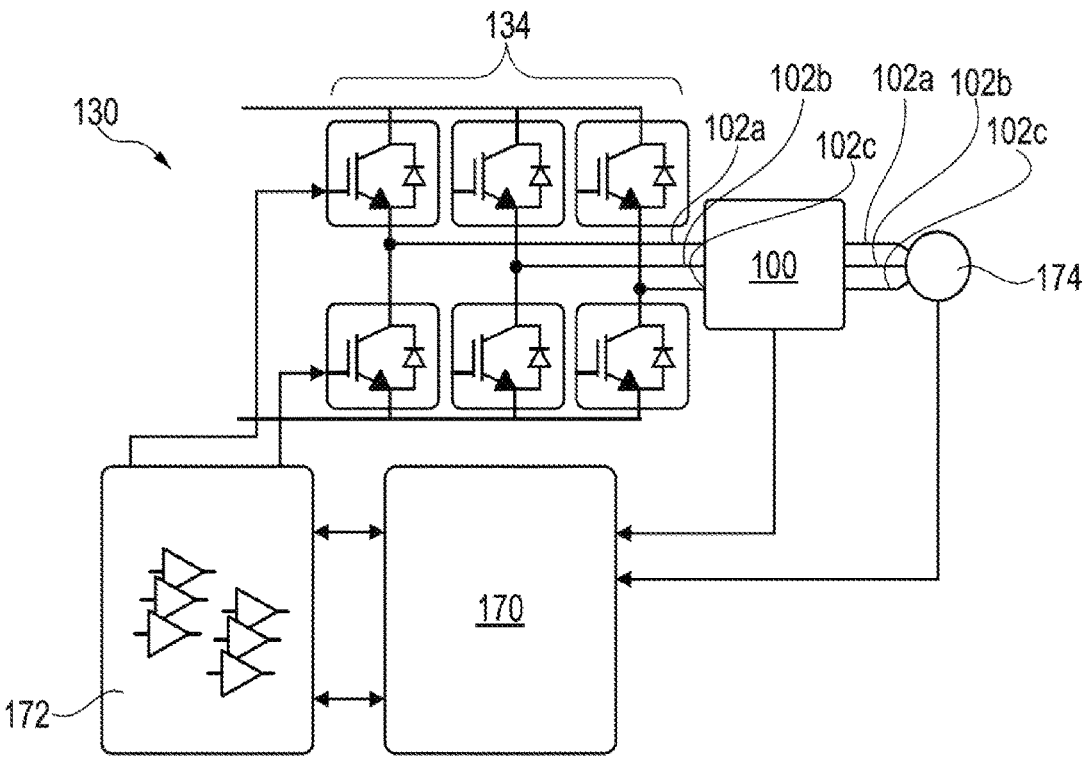
FIG. 13 shows a circuit diagram of an electronic device having a magnetic coreless current sensor module and a busbar, and having an inverter circuit, according to one example implementation.

FIG. 13 shows a circuit diagram of an electronic device 130 having a magnetic coreless current sensor module 100, a busbar 102 and an inverter circuit 134, according to one example implementation.

The circuit diagram according to FIG. 13 shows an inverter circuit 134 comprised of transistors which, via a plurality of busbars 102a, 102b, 102c, is coupled to a motor 174 (by way of individual phases of the motors). Current sensor modules 100 according to the present disclosure can measure a respective alternating electric current on each of the busbars 102a, 102b, 102c, and execute the relaying thereof to a control device 170. Based on associated phase information from the three current signals, a driver stage 172 for driving the transistors of the inverter 134 can be actuated, in a manner which is known to a person skilled in the art.

Current sensor modules 100 according to the present disclosure can also be employed on the input side of an inverter circuit 134.

Figure 14:
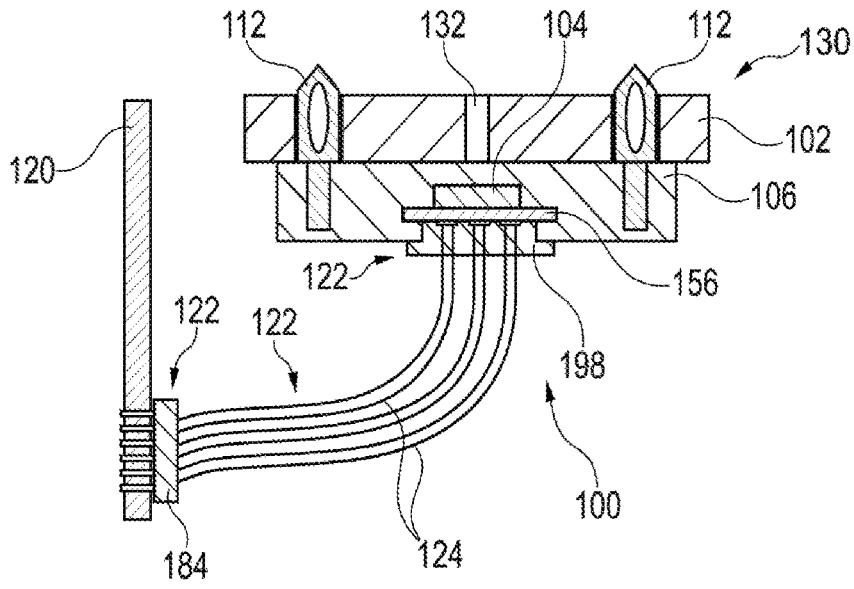
FIG. 14 shows a cross-sectional view of an electronic device having a magnetic coreless current sensor module and a busbar, according to a further example implementation.

FIG. 14 shows a cross-sectional view of an electronic device 130 having a magnetic coreless current sensor module 100 and a busbar 102, according to a further example implementation.

In FIG. 14, by way of distinction from contact-connection according to the above-mentioned example implementations, a plug-and-socket arrangement 122 is provided which, using an electrical connecting cable 124, is configured for the electrically conductive coupling of the circuit board 120 and the electronic component 104.

A plug 184 is plugged directly onto the circuit board 120. The plug 184 forms one end of the plug-and-socket arrangement 122. An opposite end of the plug-and-socket arrangement 122 is equipped with a socket-type (or plug-type) connector 198, which is fitted to the carrier 156.

According to FIG. 14, the circuit board 120 can thus be rotated, for example through 90°, vis-à-vis the busbar 102. The connecting cable 124 can, for example, be soldered to the connector 198 in the interior of the encapsulation 106, and encapsulated.

It is also possible for the plug-and-socket arrangement 122 to be configured with a respective combination of a plug and socket for coupling to the carrier 156 on one side, and for coupling to the circuit board 120 on the other (not represented). In this case, two plug-and-socket combinations can thus be provided.

Figures 15, 16, 17:
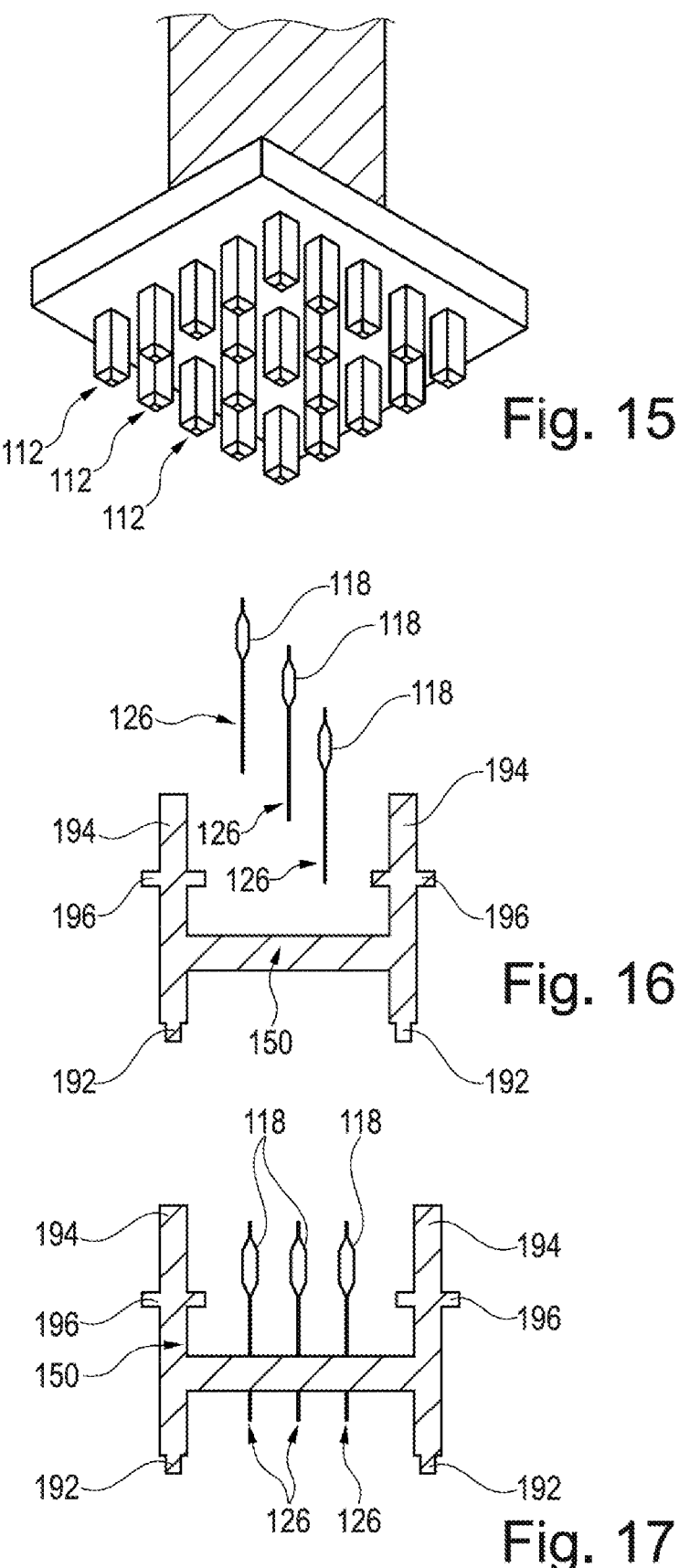
FIG. 15 shows a two-dimensional arrangement of press-fit elements for a magnetic coreless current sensor module, according to one example implementation.
FIG. 16 shows a spacer, which functions as an assembly aid for electromechanical connection elements, for a magnetic coreless current sensor module, according to one example implementation.
FIG. 17 shows the spacer according to FIG. 16, with electromechanical connection elements fitted thereto.

FIG. 15 shows an example two-dimensional arrangement of press-fitting elements configured in the form of press-fit elements 112 for a magnetic coreless current sensor module 100 according to one example implementation. Using press-fit elements 112 integrated in a common body, according to FIG. 15, a press-fit connection between a busbar 102 and an encapsulation 106 of a current sensor module 100 can be configured in a particularly simple manner. A person skilled in the art will recognize that a press-fit element 112 of this type can also be employed as an individual element and is not necessarily executed in the form of an array of press-fit elements 112.

FIG. 16 shows a spacer 150, which functions as an assembly aid for electromechanical connection elements 126, for a magnetic coreless current sensor module 100, according to one example implementation.

According to FIG. 17, electromechanical connection elements 126 are fitted to the spacer 150 according to FIG. 16. The connection elements 126, which are configured in the form of press-fit pins, can be inserted, for example, into the spacer 150, which is configured in the form of a plastic frame.

Figure 18:
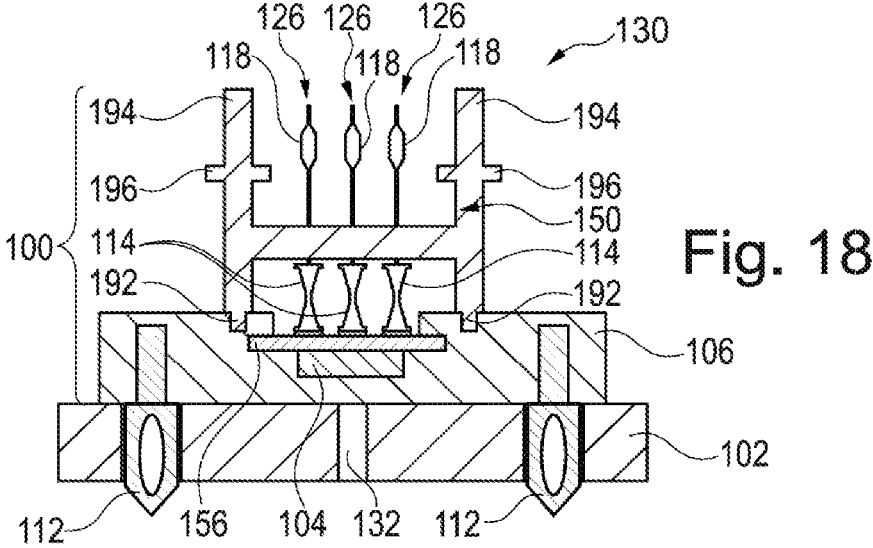
FIG. 18 shows the spacer connected to electromechanical connection elements, according to FIG. 16 and FIG. 17, with further elements of the magnetic coreless current sensor module.

FIG. 18 shows the spacer 150 connected using electromechanical connection elements 126 according to FIG. 17, further to the formation of a connection with further elements of the magnetic coreless current sensor module 100. The spacer 150 is now connected to the encapsulation 106, for example by the introduction and, optionally, adhesive bonding of connecting pins 192 of the spacer 150 in further connecting holes of the encapsulation 106. The electromechanical connection apparatuses 114, which are configured in the form of connecting bushes, ensure that the pin ends of the connection elements 126 are centered.

Figure 19:
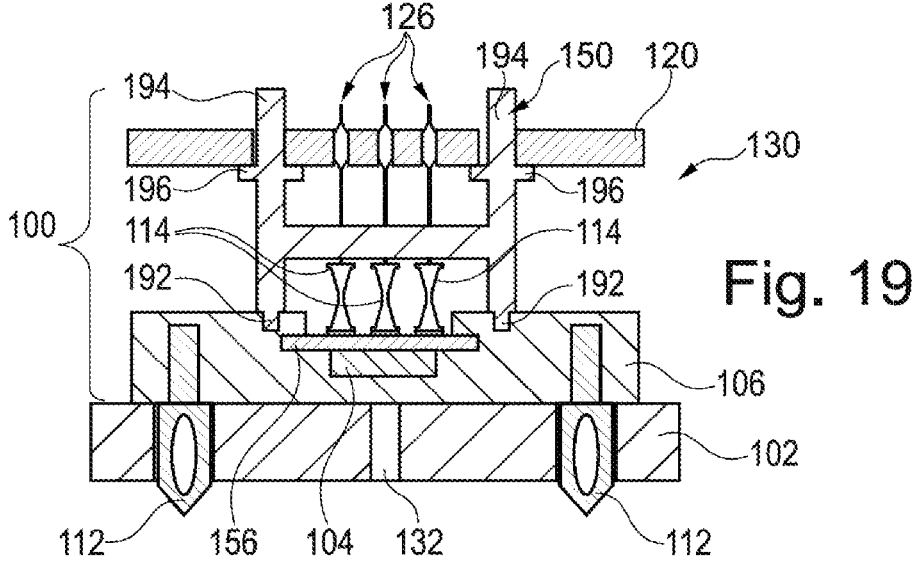
FIG. 19 shows the magnetic coreless current sensor module according to FIG. 18, with a circuit board fitted thereto.

FIG. 19 shows the magnetic coreless current sensor module 100 according to FIG. 18, with the circuit board 120 fitted thereto. In order to obtain the electronic device 130 according to FIG. 19, the circuit board 120 is fitted to the spacer 150, wherein overhangs 194 of the spacer 150 are led through additional connecting holes in the circuit board 120, until limit stops 196 on the spacer 150 engage with the circuit board 120.

According to FIGS. 16 to 19, the busbar 102 and the current sensor module 100 can thus be connected by a press-fit process. Bores in the circuit board 120 can be configured to a larger size than the associated pins, in order to restrict a maximum offset between the circuit board 120 and the remainder of the current sensor module 100. This ensures that press-fit pins can be employed within their tolerance range. Limit stops 196, optionally in cooperation with the connecting pins 192, prevent any over-insertion of the press-fit pins 126.

Figures 20, 21:
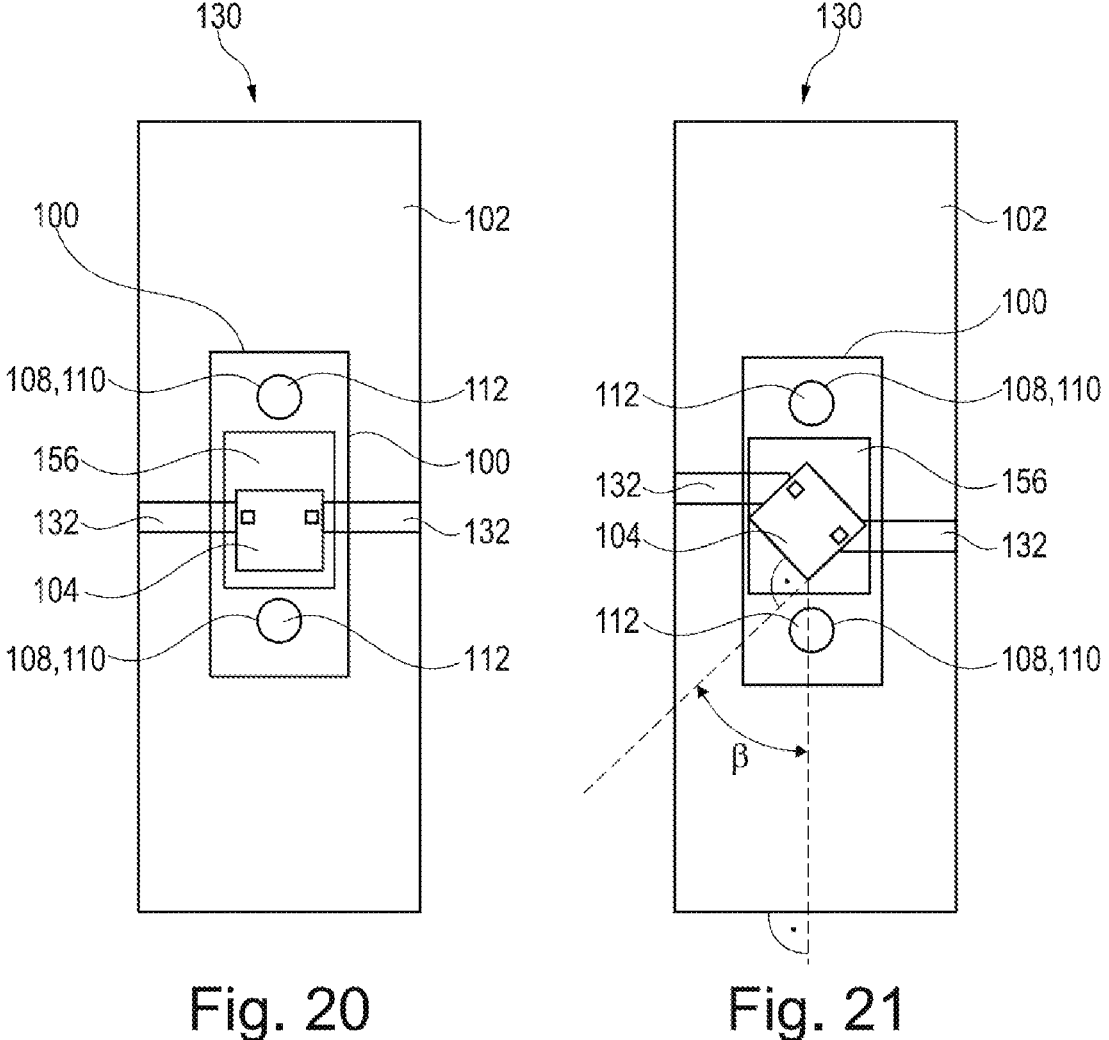
FIG. 20 shows an overhead view of an electronic device having a magnetic coreless current sensor module and a busbar, according to one example implementation.
FIG. 21 shows an overhead view of an electronic device having a magnetic coreless current sensor module and a busbar, according to another example implementation.

FIG. 20 shows an overhead view of an electronic device 130 having a magnetic coreless current sensor module 100 and a busbar 102, according to one example implementation. FIG. 20 shows that the electronic component 104 for measuring the current in the busbar 102 can be arranged in the region of a taper between slots 131, as described above with reference to FIGS. 1 to 6.

FIG. 21 shows an overhead view of an electronic device 130 having a magnetic coreless current sensor module 100 and a busbar 102 according to another example implementation. FIG. 21 particularly differs from FIG. 4 in that, according to FIG. 21, not the entire current sensor module 100 is rotated vis-à-vis the busbar 120. Instead, according to FIG. 21, a main extension direction of the busbar 102 is arranged in parallel with a main extension direction of the current sensor module 100. However, the electronic component 104 within the current sensor module 100 is rotated vis-à-vis the main extension direction of the busbar 102 through an angle β, in order to reduce crosstalk.

It should further be observed that the term "comprising" does not exclude any other elements or steps, and that the term "a" or "an" does not exclude a plural. It should further be observed that features or steps which have been described with reference to one of the above-mentioned example implementations can also be employed in combination with other features or steps of other above-mentioned example implementations. Reference numbers in the claims are not to be considered by way of limitation.

The invention claimed is:

1. A magnetic coreless current sensor module for measuring an electric current flowing in a busbar, wherein the magnetic coreless current sensor module comprises:
   an electronic component configured to measure the electric current;
   an electrically insulating encapsulation, in which the electronic component is at least partially encapsulated, wherein the electrically insulating encapsulation comprises at least one connecting hole for connecting the electrically insulating encapsulation to the busbar; and
   at least one press-fit element configured to connect the electrically insulating encapsulation to the busbar using an introduction of the at least one press-fit element into the at least one connecting hole of the electrically insulating encapsulation and into at least one further connecting hole of the busbar,
   wherein the at least one press-fit element comprises a deformable section which, for connecting the busbar to the electrically insulating encapsulation in at least one further connecting hole of the busbar, is compressible transversely to an insertion direction of the at least one press-fit element.

2. The magnetic coreless current sensor module as claimed in claim 1, wherein the electrically insulating encapsulation comprises two connecting holes for connecting to the busbar, and the magnetic coreless current sensor module comprises two press-fit elements for introduction into the connecting holes, in order to connect the electrically insulating encapsulation to the busbar.

3. The magnetic coreless current sensor module as claimed in claim 1, wherein the at least one press-fit element is selected from a group comprising at least one beveled contact, at least one hot-caulked plastic dome, and at least one rivet.

4. The magnetic coreless current sensor module as claimed in claim 1, further comprising a circuit board, which is connected or connectable to the electronic component in an electrically conductive manner.

5. The magnetic coreless current sensor module as claimed in claim 4, further comprising a plug-and/or-socket arrangement which, using a connecting cable, is configured for an electrically conductive coupling of the circuit board and the electronic component.

6. The magnetic coreless current sensor module as claimed in claim 4, wherein the electrically insulating encapsulation is secured on or above the circuit board using at least one spacer between the electrically insulating encapsulation and the circuit board.

7. The magnetic coreless current sensor module as claimed in claim 1, further comprising at least one electromechanical connection apparatus, which is released from the electrically insulating encapsulation, for a communication of a sensor signal which is generated by the electronic component based on the electric current.

8. A magnetic coreless current sensor module for measuring an electric current flowing in a busbar, wherein the magnetic coreless current sensor module comprises:
   an electronic component configured to measure the electric current;
   an electrically insulating encapsulation, in which the electronic component is at least partially encapsulated, wherein the electrically insulating encapsulation is configured to connect to the busbar; and
   at least one electromechanical connection apparatus, which is released from the electrically insulating encapsulation, configured for a communication of a sensor signal which is generated by the electronic component based on the electric current.

9. The magnetic coreless current sensor module as claimed in claim 8, wherein the electromechanical connection apparatus comprises at least one at least partially funnel-shaped location channel configured for an accommodation of an electromechanical connection element.

10. The magnetic coreless current sensor module as claimed in claim 9, further comprising the electromechanical connection element configured for electromechanical connection to the at least one electromechanical connection apparatus.

11. The magnetic coreless current sensor module as claimed in claim 10, wherein the electromechanical connection element is an electromechanical press-fitting element.

12. The magnetic coreless current sensor module as claimed in claim 11, wherein the electromechanical press-fitting element comprises a deformable section, which is compressible into at least one metal-lined connecting bushing of a circuit board, transversely to an insertion direction of the electromechanical press-fitting element.

13. The magnetic coreless current sensor module as claimed in claim 10, wherein the electromechanical connection element is inserted or insertable into at least one metal-lined connecting bushing in a circuit board.

14. The magnetic coreless current sensor module as claimed in claim 13, wherein the electromechanical connection element is configured for transmitting the sensor signal from the at least one electromechanical connection apparatus to the at least one metal-lined connection bushing of the circuit board.

15. The magnetic coreless current sensor module as claimed in claim 8, wherein the electrically insulating encapsulation comprises at least one connecting hole for connecting the electrically insulating encapsulation to the busbar, and wherein the magnetic coreless current sensor module further comprises at least one press-fit element configured to connect the electrically insulating encapsulation to the busbar using an introduction of the at least one press-fit element into the at least one connecting hole of the electrically insulating encapsulation and into at least one further connecting hole of the busbar.

16. An electronic device, comprising:

a magnetic coreless current sensor module for measuring an electric current flowing in a busbar, wherein the magnetic coreless current sensor module comprises:
an electronic component configured to measure the electric current;
an electrically insulating encapsulation, in which the electronic component is at least partially encapsulated, wherein the electrically insulating encapsulation comprises at least one connecting hole for connecting to the busbar; and
at least one press-fit element configured to connect the electrically insulating encapsulation to the busbar using an introduction of the at least one press-fit element into the at least one connecting hole of the electrically insulating encapsulation and into at least one further connecting hole of the busbar; and
the busbar having the at least one further connecting hole for connecting to the magnetic coreless current sensor module, wherein the electrically insulating encapsulation is connected or connectable to the busbar using the introduction of the at least one press-fit element into the at least one connecting hole of the electrically insulating encapsulation and into the at least one further connecting hole of the busbar, and wherein the at least one press-fit element comprises a deformable section which, for connecting the busbar to the electrically insulating encapsulation in at least one further connecting hole of the busbar, is compressible transversely to an insertion direction of the at least one press-fit element.

17. The electronic device as claimed in claim 16, wherein the magnetic coreless current sensor module is arranged in a taper of the busbar.

18. The electronic device as claimed in claim 16, wherein the magnetic coreless current sensor module is oriented along a main extension direction of the busbar.

19. The electronic device as claimed in claim 16, wherein a main extension direction of the magnetic coreless current sensor module, or a main extension direction of only the electronic component of the magnetic coreless current sensor module, encloses an angle with a main extension direction of the busbar which differs from zero and is no more than 45°.

20. The electronic device as claimed in claim 16, further comprising an inverter circuit which is electrically coupled to the busbar.

21. The electronic device as claimed in claim 16, wherein a connection of the electrically insulating encapsulation to the busbar is screwless.

22. The electronic device as claimed in claim 16, wherein the magnetic coreless current sensor module is arranged on only a first one of two opposing main surfaces of the busbar, and the electrically insulating encapsulation is connected or connectable to the busbar from a second one of the two opposing main surfaces of the busbar, using the at least one press-fit element.

23. An electronic device, comprising:

a magnetic coreless current sensor module for measuring an electric current flowing in a busbar, wherein the magnetic coreless current sensor module comprises:
an electronic component configured to measure the electric current;
an electrically insulating encapsulation, in which the electronic component is at least partially encapsulated, wherein the electrically insulating encapsulation is configured to connect to the busbar; and
at least one electromechanical connection apparatus, which is released from the electrically insulating encapsulation, configured for a communication of a sensor signal which is generated by the electronic component based on the electric current;
at least one electromechanical connection element which is plugged or pluggable into the at least one electromechanical connection apparatus; and
the busbar, which is connected or connectable to the magnetic coreless current sensor module.

24. A method for retrofitting a busbar with a magnetic coreless current sensor module, wherein the method comprises:

provisioning of a magnetic coreless current sensor configured to measure an electric current flowing in a busbar, wherein the magnetic coreless current sensor module comprises:
an electronic component configured to measure the electric current;
an electrically insulating encapsulation, in which the electronic component is at least partially encapsulated, wherein the electrically insulating encapsulation comprises at least one connecting hole for connecting to the busbar; and
at least one press-fit element configured to connect the electrically insulating encapsulation to the busbar using an introduction of the at least one press-fit element into the at least one connecting hole of the electrically insulating encapsulation and into at least one further connecting hole of the busbar; and
connecting the electrically insulating encapsulation to the busbar using the introduction of the at least one press-fit element into the at least one connecting hole of the electrically insulating encapsulation and into the at least one further connecting hole of the busbar, wherein the at least one press-fit element comprises a deformable section which, for connecting the busbar to the electrically insulating encapsulation in at least one further connecting hole of the busbar, is compressible transversely to an insertion direction of the at least one press-fit element.

25. A magnetic coreless current sensor module for measuring an electric current flowing in a busbar, wherein the magnetic coreless current sensor module comprises:

an electronic component configured to measure the electric current;
an electrically insulating encapsulation, in which the electronic component is at least partially encapsulated, wherein the electrically insulating encapsulation comprises at least one connecting hole for connecting the electrically insulating encapsulation to the busbar; and at least one press-fit element configured to connect the electrically insulating encapsulation to the busbar using an introduction of the at least one press-fit element into the at least one connecting hole of the electrically insulating encapsulation and into at least one further connecting hole of the busbar, wherein the electrically insulating encapsulation is in direct contact with the electronic component for at least partially encapsulating the electronic component.

26. The magnetic coreless current sensor module as claimed in claim 25, further comprising:

a carrier on which the electronic component is arranged and to which the electronic component is electrically coupled, wherein the electrically insulating encapsulation is in direct contact with the carrier and the electronic component, and wherein the electrically insulating encapsulation at least partially encapsulates the carrier and the electronic component.

27. The magnetic coreless current sensor module as claimed in claim 26, wherein the electronic component is fully encapsulated by a combination of the electrically insulating encapsulation and the carrier.

\* \* \* \* \*